United States Patent [19]
Wu et al.

[11] Patent Number: 6,090,456
[45] Date of Patent: Jul. 18, 2000

[54] PROCESS FOR LARGE AREA DEPOSITION OF DIAMOND-LIKE CARBON FILMS

[75] Inventors: Richard L.C. Wu, Beavercreek; William C. Lanter, Fairborn; Peter Bletzinger, Fairborn, all of Ohio

[73] Assignee: The United States of America as represented by the Secretary of the Air Force, Washington, D.C.

[21] Appl. No.: 08/850,580

[22] Filed: May 3, 1997

Related U.S. Application Data

[60] Provisional application No. 60/016,534, May 3, 1996.

[51] Int. Cl.$^7$ .............................. H05H 1/24; C23C 16/26
[52] U.S. Cl. ...................... 427/577; 427/249.7; 427/122; 427/902; 427/904
[58] Field of Search .................................... 427/249, 523, 427/577, 595, 122, 255.5, 249.7, 902, 904; 423/446

[56] References Cited

U.S. PATENT DOCUMENTS

| | | | |
|---|---|---|---|
| 5,198,718 | 3/1993 | Davis et al. | 313/359.1 |
| 5,313,067 | 5/1994 | Houk et al. | 250/452.21 |
| 5,455,081 | 10/1995 | Okada et al. | 427/528 |

FOREIGN PATENT DOCUMENTS 6-116733   4/1994   Japan .

OTHER PUBLICATIONS

Zhang et al, Opt. Eng. (Bellingham, Wash.) 33(4) 1994, pp. 1330–3.

Druz et al, Surf. Coat. Technol., 86–87 (1–3) 1996, pp. 708–714.

Keeley et al, Proc. Int. Symp. Diamond Diamond–like Films, 1st, 1989, pp. 250–260, 1989.

L. Wang et al, J. Appl. Phys. 79(8) pp. 5776–578, Apr. 1996.

D. Swec et al, NASA Technical Memorandum 10211 "Diamondlike Carbon Protective Coatings for Optical Windows" p. 1–16, Mar. 1989.

*Primary Examiner*—Roy V. King
*Attorney, Agent, or Firm*—Fredric L. Sinder; Thomas L. Kundert

[57] ABSTRACT

A new method for ion beam deposition of diamond-like carbon coatings onto a variety of substrates is described. A high power, radio frequency excited-inductively coupled ion gun directs a beam of carbon and hydrogen ions at a substrate inside an ultra vacuum deposition chamber. A four axis scanner is used for coating large and nonplaner substrates. A quadrupole mass spectrometer is mounted inside the deposition chamber for real time monitoring of ion composition. The disclosed method is particularly effective for coating zinc sulfide and zinc selenide infrared windows.

4 Claims, 1 Drawing Sheet

PROCESS FOR LARGE AREA DEPOSITION OF DIAMOND-LIKE CARBON FILMS

CROSS-REFERENCE TO RELATED APPLICATIONS

This application claims priority under 35 U.S.C. § 119(e) from U.S. Provisional Application Ser. No. 60/016,534, filed May 3, 1996, by applicants Richard C. Wu, William C. Lanter and Peter Bletzinger, entitled Process For Large Area Deposition Of Diamond-Like Carbon Films. The invention description contained in that provisional application is incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to ion beam deposition processes, and more specifically to an improved ion beam process for depositing diamond-like carbon coatings onto a variety of substrates.

Diamond-like carbon (DLC) coatings have become an area of intense research and experimentation. Diamond-like carbon generally consists of hydrocarbon structures that exhibit properties similar to those of diamonds. Diamond-like carbon exhibits a low coefficient of friction, high wear resistance, extreme hardness, extreme corrosion resistance and exceptional scratch resistance. DLC used as a hard coating has diverse applications in such areas as tribology, optics and electronics.

A particular advantage of DLC coatings is that they can be applied at relatively low temperatures, typically lower than 300° C. Diamond coatings, while usually displaying physical properties superior to those of DLC coatings, are created at much higher temperatures, typically higher than the melting temperature of the substrate onto which a coating is desired to be placed.

Many different methods for depositing DLC films or coatings currently exist. Several elements are common among these methods. Typically, a DLC deposition apparatus consists, in its most basic form, of an ion gun or ion source, an evacuation or vacuum chamber, and an apparatus for holding a substrate to be coated.

Prior art methods for producing DLC films utilize as an ion source derivatives of a so-called Kaufman source. A Kaufman ion source incorporates high current metallic filaments (so-called hot-filament sources) mounted inside a vacuum vessel to ionize hydrocarbon gas molecules, such as methane ($CH_4$), to form a carbon rich plasma which is accelerated by the beam of ions from the Kaufman source to strike a substrate to be coated with the DLC film or coating.

Unfortunately, conventional prior art methods for depositing DLC coatings using Kaufman sources have many drawbacks. The primary disadvantage is that metal vapor produced by hot filaments inside the vacuum chamber contaminates the carbon ions extracted from the plasma. Moreover, the hot filaments have very short lifetimes, typically only a few hours, depending on the gaseous mixture and pressure.

Additionally, these prior art ion deposition methods only enable the user to deposit DLC onto a small planar surface area of a substrate. This severely limits the usefulness, particularly the commercial usefulness, of diamond-like carbon coatings.

A very important limitation of prior art methods is the types of substrates onto which DLC coatings can be successfully deposited. Adhesion between DLC and many substrates, particularly metals, is typically extremely poor due to the inherent compressive stress of DLC. The DLC film will usually expand or contract when removed from the vacuum chamber and that expansion or contraction results in compressive stresses inside the film which can make it peel away from the substrate. Existing methods of deposition attempt to remedy this problem by introducing an intermediate layer, such as silicon (Si), between the substrate and the DLC. This is done by first depositing the intermediate layer onto the substrate and then depositing the DLC on top of the intermediate layer.

There is a need in the prior art not only for improved apparatus for depositing DLC coatings, but also for the effects of control parameters such as ion energy, power, gas composition and substrate temperature on DLC characteristics. Those characteristics include such properties as adhesion to substrate, friction and wear behavior, infrared (IR) transmission and electrical properties. To date, despite much experimentation, and despite improved apparatus such as is described as part of the present invention, ion beam deposition of DLC coatings having characteristic properties suitable for a desired application is, at best, a hit or miss process. By "at best" is meant that most often no successful DLC coating for a particular application can be achieved. By "hit or miss" is meant that, even when successful DLC coatings are achieved, they are not repeatable and control parameters for achieving a practical degree of repeatability are not well defined.

An example of an application for DLC coatings is as a coating for infrared window materials. Zinc selenide (ZnSe) and zinc sulfide (ZnS) are currently used as domes or windows in infrared sensor systems. These are excellent optical materials for applications throughout the infrared and visible regions of the spectrum. Unfortunately, these materials are mechanically soft and undergo significant degradation when subject to chemical attack, rain erosion and sand impact. Thus, the development of economical techniques to significantly improve the hardness of these materials without degrading the integrity of the specular transmittance is a great current interest. DLC coatings, if they can be successfully applied to ZnS and ZnSe surfaces, will be of great value.

Another example of an application for DLC coatings is as a coating for surfaces intended to be used in the ultrahigh vacuum of space. An example of such a surface is chemical-vapor deposited (CVD) fine-grain diamond coatings. Both the coefficients of friction (0.4 to 2.0) and the wear rate ($10^{-4}$ $mm^3/Nm$) of CVD diamond films are considerably higher than in air or in dry nitrogen. The presence of an amorphous, nondiamond carbon layer on CVD diamond films decreases both friction and wear in ultrahigh vacuum, resulting in a low steady-state coefficient of friction (<0.1) and a low wear rate ($\leq 10^{-6}$ $mm^3/Nm$) One method for producing such a layer on CVD diamond films is ion implantation. Ion implantation produces acceptable levels of friction and wear of CVD diamond films, but the depth of implantation is very shallow which may limit the tribological applications of ion implantation to light loads or short-term operations. The thickness range of DLC films can be 0.1 to 5 $\mu$m, an order of magnitude greater than ion-implanted layers. Therefore, an amorphous DLC film coated on a CVD diamond film can enhance the tribological properties of such films, particularly for increasing the endurance of CVD diamond films.

Thus it is seen that there is a need for an improved method for successfully depositing diamond-like carbon coatings directly onto a variety of substrate materials, and for the control parameters necessary for successful application of DLC coatings onto specific substrates.

It is, therefore, a principal object of the present invention to provide an improved method for depositing diamond-like carbon coatings onto a variety of substrate materials, and to define the control parameters necessary for successful application of DLC coatings onto specific substrates.

It is a feature of the present invention that its ion beam source will not contaminate ions extracted from the ion plasma.

It is a feature of the present invention that the characteristics of the source plasma can be monitored and controlled so that a user can monitor and control on a real-time basis the resulting characteristics of the diamond-like carbon coating.

It is another feature of the present invention that its ion beam source has an extended lifetime and more efficiently transfers ions to a substrate.

It is an advantage of the present invention that it can deposit diamond-like carbon coatings over large and nonplanar substrate surface areas.

SUMMARY OF THE INVENTION

The present invention provides a highly efficient method for depositing diamond-like carbon coatings directly onto substrates having large nonplanar surface areas and specific control parameters for successfully applying DLC coatings on zinc sulfide and zinc selenide infrared window surfaces. The disclosed method uses a high power, radio frequency excited-inductively coupled ion gun, along with a four-axis scanner for moving substrates and an on-line quadrupole mass spectrometer for monitoring ion composition. The radio frequency (RF) excited-inductively coupled ion gun provides a source of contamination-free ions and an ion source with an extended lifetime. The scanner allows nonplanar surfaces to be coated with DLC films by providing movement in 4 planes, X, Y, θY and θZ. The quadrupole mass spectrometer provides for in-situ monitoring of the characteristics of the ion beam, and consequently the characteristics of the resulting DLC coating.

Accordingly, the present invention is directed to an ion beam method for depositing a diamond-like carbon film onto a substrate, comprising the steps providing a vacuum chamber, providing a radio frequency excited inductively coupled ion source for generating an ion beam of carbon-hydrogen ions inside the vacuum chamber, and accelerating the ion beam towards the substrate. The method may further comprise the step of providing a four-axis scanner for moving the substrate across the ion beam.

The present invention is additionally directed to an ion beam method for depositing a diamond-like carbon film onto a zinc sulfide or a zinc selenide substrate, comprising the steps of providing a vacuum chamber, providing a radio frequency excited inductively coupled ion source for generating an ion beam of carbon-hydrogen ions inside the vacuum chamber, and accelerating the ion beam towards the zinc sulfide substrate, wherein the accelerating energy for the ion beam is about 750 eV. The carbon-hydrogen ions may be generated from a flow of $CH_4$ gas and $H_2$ gas, wherein the ratio of the flow rate of the $CH_4$ gas to the flow rate of the $H_2$ gas is about 0.68. The radio frequency energy supplied by the radio frequency excited inductively coupled ion source may be about 180 watts.

BRIEF DESCRIPTION OF THE DRAWINGS

The present invention will be more clearly understood from a reading of the following detailed description in conjunction with the accompanying drawing, wherein.

DETAILED DESCRIPTION

Figure 1:
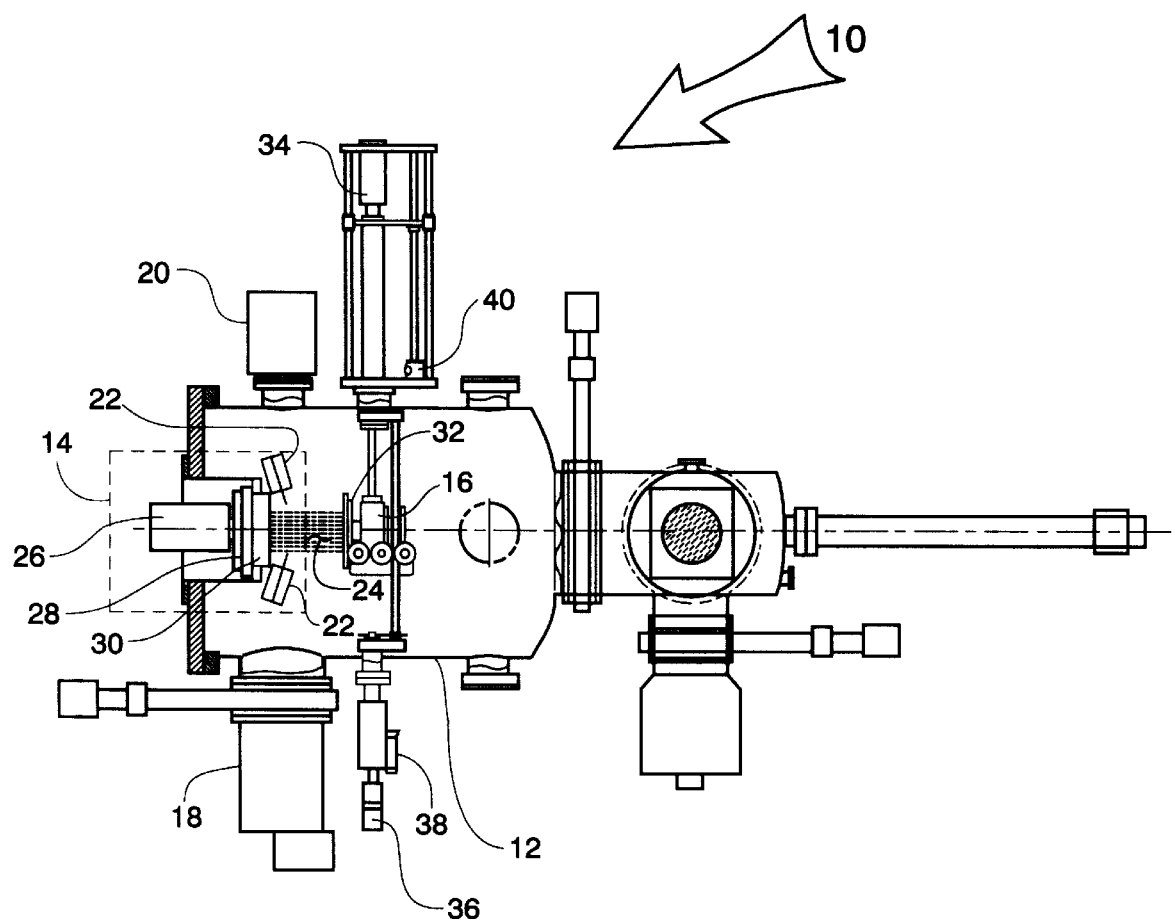
FIG. 1 is a schematic view of a diamond-like carbon ion deposition apparatus made according to the teachings of the present invention.

Referring now to FIG. 1 of the drawings, there is shown a schematic view of an ion beam deposition apparatus 10 capable of depositing diamond-like carbon coatings directly onto a substrate. The primary components of ion deposition apparatus 10 are a vacuum, or deposition, chamber 12, a radio frequency (RF) excited-inductively coupled ion gun 14 and a four-axis scanner 16. Also attached to vacuum chamber 12 is a quadrupole mass spectrometer (not shown).

Deposition chamber 10 is made from stainless steel and is 92 cm in diameter and 102 cm in length. It is pumped by a CTI cyropump 18 capable of pumping 5000 liters per second combined with a Varian Starcell ion pump 20 capable of pumping 230 liters per second. The background pressure is normally $1.33 \times 10^{-7}$ Pa. During deposition, the pressure is about $1.33 \times 10^{-2}$ Pa.

Ion gun 14 is a highly efficient RF (13.56 MHz) inductively coupled ion gun with a diameter of 20 cm made by Nordiko, Inc. and can generate very high beam currents. Highly efficient hollow cathodes 22 are used to discharge Ar to produce electrons for neutralization. The quadrupole mass spectrometer is used on-line to monitor the important ionic species during the deposition process for quality control. A gas inlet system can introduce four premixed gases into the ion source. The flow rate of each gas is controlled by an MKS mass flow controller. The gases used are methane (99.99%), argon (99.99%) and hydrogen (99.99%).

Ion gun 14 creates a broad ion beam 24 as a result of its 20 cm diameter antenna/coil. Ion gun 14 utilizes RF source 26 to create and excite the ions which form the ion beam 24. Radio frequency source 26 is inductively coupled to vacuum chamber 12 through a dielectric window 28. Dielectric window 28 forms one end of a plasma generation region 30. An acceleration grid and a focusing grid form the other end of plasma generation region 30.

Gas is introduced into plasma generation region 30 where a carbon rich plasma is created. Radio frequency source 26 ionizes this plasma and the acceleration grid and focusing grid transform the plasma into ion beam 24. Resulting ion beam 24 deposits a DLC coating onto the substrate. Ion gun 14 is equipped with neutralizers 22 which neutralize ion beam 24 by adding $Ar^+$ ions to the beam.

The energy of ion beam 24 can be varied from 50 eV to 3000 eV.

Four axis substrate scanner 16 is used for coating DLC onto larger areas, typically above 1000 $cm^2$. Scanner 16 comprises X-drive motor 34, Z-rotation motor 36, Y-rotation motor 38 and Y-drive motor 40, and sample mounting plates for coupling a substrate to a cooling/heating plate 32. Cooling/heating plate 32 allows the substrate to achieve temperatures between −200° C. and 1000° C. Cooling plate 32 is formed with a chamber spiraling outwardly from its center such that a cooling liquid can flow through the chamber and cool the mounting plate and ultimately the substrate. Scanner 16 provides for a range of motion along 4 axes, X, Y, θY, and θZ, achieved through the use of motors 34, 36, 38 and 40.

The mass spectrometer is coupled to vacuum chamber 12. The mass spectrometer is a quadrupole gas analyzer comprising an analyzer and a Faraday cup. The Faraday cup is constructed from stainless steel and has a 1 $cm^2$ opening.

The Faraday cup is positioned between ion gun 14 and a substrate approximately perpendicular to ion beam 24. The mass spectrometer collects and analyzes positive ion and neutral and free radical molecules in order to determine the composition of ion beam 24.

In use with a substrate, apparatus 10 is used to deposit DLC coatings directly onto one or more dynamic surfaces of the substrate. The substrate is first cleaned through traditional chemical processes. This cleaning process typically involves the use of solvents or other surface cleansers.

Next, the substrate is placed within vacuum chamber 12 and onto the sample mounting plates on scanner 16 through the use of a transfer rod. The substrate is positioned approximately 43.2 cm (17 in.) from ion gun 14.

After the substrate is placed within vacuum chamber 12, pumps 18 and 20 are activated to create a vacuum within vacuum chamber 12. This process includes initial rough pumping and high vacuum pumping. Vacuum chamber 12 is evacuated until its internal pressure is between $6 \times 10^{-6}$ and $2.4 \times 10^{-8}$ torr. Pumps 18 and 20 are continually active during the deposition process so that an internal pressure of $1 \times 10^{-3}$ to $8 \times 10^{-5}$ torr can be maintained.

One or more surfaces of the substrate are first conditioned through ion sputtering. Ion sputtering is accomplished by utilizing ion gun 14 to produce $Ar^+$ ions, from argon gas, which are accelerated towards and bombard one or more surfaces of the substrate. The impact of the ions results in a sputtered cleaning of those surfaces. RF ion source 14 can be operated at a relatively low pressure ($10^{-4}$–$10^{-5}$ torr) with a sufficiently high beam current. Thus, it is an ideal source for generating atomic ions of $Ar^+$, $H^+$, $O^+$ and $N^+$ for sputtering and reactive deposition applications. The ion beam current can yield up to 5.4 $mA/cm^2$, while the ion energy can be varied from 50 to 3000 eV. A typical $N^+/N_2^+$ ion intensity ratio was about 0.4 in the RF power range of 250 W to 500 W. A typical $O^+/O_2^+$ ion intensity ratio was 0.28 at RF powers less than 200 W. This ratio increased to 0.35 at RF powers of 300 W and greater.

After the substrate is conditioned, ion gun 14 is activated to begin deposition. Argon gas is introduced into plasma generation region 30 at a rate of 3 to 6 standard cubic centimeters per minute (SCCM). $CH_4$ gas is introduced into plasma generation region 30 at a rate of 10 to 30 SCCM. $H_2$ gas is introduced into plasma generation region 30 at a rate of 0 to 34 SCCM. Argon gas is introduced to neutralizers 22 at a rate of 5 SCCM.

The RF power source is set at a forward voltage of 149–300 v. The reflection voltage is set at 0 v to 15 v. The focusing grid is charged to 100–500 v at a current of 5–50 mA. The acceleration grid is charged to 100–1,500 v at a current of 100 mA–700 mA. The deposition process is continued for about 5 minutes and up to 366 minutes.

While deposition is occurring, the mass spectrometer is utilized to monitor the composition of ion beam 24. Based upon the composition of ion beam 24, the control parameters of ion gun 14 can be altered to produce specific desired results.

A substrate cannot dissipate heat because of the vacuumed environment. Thus, the temperature of the substrate is monitored and the substrate may be cooled by using the cooling apparatus of scanner 16. The substrate can be cooled by introducing water or liquid nitrogen into cooling plate 32 which effectuates a heat transfer with the substrate. Ideally, the substrate is kept at approximately room temperature.

Scanner 16 is utilized to move and reposition a substrate such that various portions of one or more surfaces of the substrate are positioned within the path of ion beam 24. The four axes of motion enable all portions of one or more surfaces of the substrate to be oriented at approximately 90° to ion beam 24 in order to completely coat the substrate with a DLC coating. The substrate is continually scanned until a DLC coating which meets predetermined characteristics is deposited onto the substrate.

Ion beam deposition apparatus 10 was used to deposit various DLC films onto a variety of substrates, including ZnS, Cleartran-ZnS, Ge-coated ZnS, Ge-coated Cleartran, Si, aluminum alloys, Ti alloys, polycrystalline diamond, polycarbonates, 304 and 316 stainless steels, 440C and M50 steels, $Si_3N_4$, SiC, glass and quartz. The parameters used for depositing the DLC films were: RF power (100–300 W), ion energy (100–1,500 eV), ion current (100–400 mA), gas mixtures $CH_4/Ar$: (0.7–6), $CH_4/H_2/O_2$: (1:1.5–2:0.15) and $CH_4/Ar/H_2$: (1:0.17:1–2), and substrate temperature (50–230° C.).

As previously described, a substrate cleaning procedure was found to be important in the adhesion of DLC films on various substrate materials. As described, an initial cleaning procedure included regular organic solvent cleaning of substrate surfaces. In addition, for metal and ceramic materials, a beam of $Ar^+$ was used to sputter clean the substrate surface prior to deposition. The sputtering rate of $Ar^+$ on Si was found to linearly increase with ion energy. Sputtering rates of 195 Å/hr and 15000 Å/hr were measured at 100 eV and 700 eV respectively. A 1/20 mixture of $Ar/H_2$ was also used to clean the surface of polycarbonates and IR windows. The mass spectra of $Ar/H_2$ discharges showed that $H_n^+$ (n=1,2 and 3) were the dominant ions.

In order to maintain a stable RF discharge inside the 20 cm ion source, Ar and $H_2$ gases were mixed with $CH_4$. The deposition rate of DLC was found to be strongly dependent upon the gas mixture ($Ar/CH_4$, $H_2/CH_4$), ion energy and substrate materials. Mass spectra showed that $CH_3^+$ is the dominant hydrocarbon ion. The $Ar^+$ and $ArH^+$ ions were also important depending upon the $Ar/CH_4$ ratio. In the gas mixture of $H_2/CH_4$, the $H_2^+$ and $H_3^+$ ions were more dominant than $CH_3^+$ as the ratio of $H_2/CH_4$ increased. By introducing Ar in the ion source, the total ion current increases, resulting in an increase in DLC deposition. However, at higher ion energies, the $Ar^+$ can sputter the DLC film during the deposition, resulting in a decrease of DLC film growth.

The deposition rate was also found to increase with an increase in ion energy due to better focusing of the ion beam, if the sputtering process was negligible. The rate of DLC on glass substrates was much higher than that on Si. The deposition rate, however, was found to be constant at substrate temperatures in the range of 45–230° C. for a wide range of gas mixtures.

Table I gives the chemical composition of DLC films as a function of substrate materials Si, Ni and Glass at a constant gas mixture ($Ar/CH_4/H_2$) and ion energy of 1500 eV. Within the analysis uncertainty of the Rutherford Backscattering (±5 atomic percent) and the hydrogen forward scattering (±5 atomic percent) techniques, the carbon and hydrogen contents of these DLC films were found to be the same on semiconductor (Si), insulator (glass) and metal (Ni), although the substrate temperature and the ion-surface interaction were different during the depositions. However, even though the DLC compositions were the same, the microstructure of these films were different, as revealed in the electrical properties as discussed below. The density of the DLC films was calculated to be varied from 1.6 to 2.0 g/cc depending on the hydrogen content.

TABLE 1

Deposition Conditions and Chemical
Composition of RF Ion Beam Diamond-like Carbon

| Expt. No./ Substrate | Ion Source Parameters | | | | DLC Compositions | | | |
|---|---|---|---|---|---|---|---|---|
| | $CH_4$ (ratio) | Ar | RF (w) | Ion Energy (eV) | C | H | Ar | C/H |
| 91/Silicon (100) | 5.7 | 1 | 149 | 1500 | 63.3 | 36 | 0.70 | 1.76 |
| 91/Glass | 5.7 | 1 | 149 | 1500 | 63.6 | 35 | 1.3 | 1.82 |
| 91/Nickel | 5.7 | 1 | 149 | 1500 | 65 | 35 | | 1.86 |

The dielectric constant ($\epsilon$) of DLC films are calculated from the measured capacitance value by the simple formula:

$$\epsilon = C\, L/A \qquad (1)$$

where C is the capacitance, A is the area and L is the thickness of the DLC film. It is interesting to note that under the same plasma parameters, the dielectric constant of the DLC films deposited on Si and glass was found to be 7.2 and 3.9 respectively, even though both DLC chemical compositions (carbon and hydrogen contents) were the same, as shown in Table I. Therefore, it is suggested that the bond polarizability in a random network of the DLC films deposited on Si and glass were different.

The dielectric constant of DLC films deposited on glass was found to increase from 2.8 at an ion energy of 500 eV to 3.9 at 1500 eV. The Raman spectra of these samples indicated that the G-position increased as the ion energy increased. From this, it is suggested that $sp^2$ bonding is more prevalent in the DLC films deposited at high ion energies.

Table II gives the friction and wear behavior of DLC films on $Si_3N_4$ and polycrystalline diamond films examined in an ultrahigh vacuum environment. The results of these experiments demonstrate that in ultrahigh vacuum both the steady-state coefficient of friction and the wear factor of the DLC films were very low, i.e., 0.04 and $<10^{-6}$ $mm^3/Nm$ respectively. Thus, the DLC films produced by the present RF ion beam technique can provide solid-lubrication and wear resistance in space-like environments.

Furthermore, using the present ion beam deposition technique, it is possible to deposit uniform DLC films, a few micrometers thick, on large flat and curved surfaces.

As previously discussed, ZnS and ZnSe are currently used as domes or windows in infrared sensor systems. Unfortunately, also as previously discussed, these materials are mechanically soft and undergo significant degradation when subject to chemical attack, rain erosion and sand impact. Thus, the development of economical techniques to significantly improve the hardness of these materials without degrading the integrity of their specular transmittance has been of current interest. The development of an adhering diamond-like carbon hard coating on these materials has been investigated using the teachings of the present invention.

Due to compressive stresses of DLC films, direct deposition of DLC films on ZnS surfaces was limited to <0.3 $\mu$m. A thin layer (0.2 $\mu$m) of DLC film containing 4% $O_2$ in the ion source gas mixture ($CH_4/H_2$=1:2) with an RF power of 179 W and 750 eV ion energy was used. This was followed by depositing a 2 $\mu$m thick DLC film with a gas mixture of $CH_4/H_2$=1:2 in the ion source. This thick combination of DLC films on ZnS successfully passed the environmental tests of high humidity and salt fog. The refractive index of the oxygen containing DLC film was found to be 1.95–2.05 in the IR region of the spectra, and that of the DLC film without the oxygen was measured to be 2.0. The mass spectra of the $CH_4/H_2$ gas mixture showed $CH_3^+$, $H_3^+$, $H_2^+$ and $H^+$ as the dominating ions. An additional $H_3O^+$ (m/e=19) ion appeared when $O_2$ was introduced into the $CH_4/H_2$ mixture. The ion intensity of $H_3O^+$ increased as the $O_2$ concentration increased. The effect of oxygen on the chemical composition of the DLC film is not known at the present time. The refractive index of the DLC film increased slightly with a decrease in ion energy, i.e., the refractive index was 2.1 and 2.2 at ion energies of 750 eV and 500 eV respectively. However, the hardness of these DLC films was found to be the same at 1500 $kg/mm^2$.

For the most successful adhesion to ZnS of a coating that had the desired index of refraction of about 2.0, a single layer of DLC was applied with the following control parameters. The RF energy from the ion gun was 180 watts, the ion acceleration energy was 750 eV, and the ratio of $CH_4$ to $H_2$ was 0.68, with no $O_2$ present. The same control parameters will apply to coating ZnSe. The tradeoff for ion energies is that higher energies provide better adhesion, but produce a more graphitic coating. Lower ion energies produce a better material, but do not adhere as well.

Composition of DLC films was determined by Rutherford backscattering (RBS) and hydrogen forward scattering (HFS) techniques. The bonding structure of DLC was studied by Raman spectroscopy and FTIR techniques. Cross sectional electron microscopy was also performed and the deposited DLC films were found to be uniform and pin-hole

TABLE II

Friction and Wear Factor of Diamond-Like Carbon Under UHV Environment

| Expt. No./Substrate | Ion Source Parameters | | | | | DLC Composition | | | | Tribology Properties | |
|---|---|---|---|---|---|---|---|---|---|---|---|
| | $CH_4$ (ratio) | Ar | $H_2$ | RF (W) | Ion Energy (eV) | C | H | Ar | C/H | Coefficient of Friction | Wear Factor ($mm^3/Nm$) |
| 156/$Si_3N_4$ | 1 | 0 | 2 | 150 | 600 | 59.5 | 40 | 0.06 | 1.49 | 0.14 | <2 (Rev.) |
| 157/$Si_3N_4$ | 1 | 0 | 2 | 150 | 500 | 59.5 | 40 | 0.06 | 1.49 | 0.1 | 500 (Rev.) |
| 158/$Si_3N_4$ | 1 | 0.18 | 0 | 176 | 750 | 59 | 40 | 0.27 | 1.48 | 0.07 | 4100 (Rev.) |
| 126/Diamond | 1 | 0.18 | 0 | 99 | 1500 | 59 | 36 | 1.8 | 1.64 | 0.05 | 4.68E-06 |
| 129/Diamond | 1 | 0.18 | 0 | 99 | | 57 | 42 | 0.8 | 1.36 | 0.04 | 1.80E-06 | free. Optical characterizations were carried out in the visible and IR regions. Rotating sliding friction experiments were conducted with CVD diamond pins (radius, 1.6 mm) with a load of 0.49 N, at a constant rotating speed of 120 rpm at room temperature under ultrahigh vacuum ($10^{-7}$ Pa). Refractive indexes were determined in the IR region of the spectra. Dielectric constants were determined by capacitance measurements. The environmental tests were performed under humidity (95–200% relative humidity, 50° C. for 10 days), and salt fog (5% NaCl at 50° C. for 24 hours) environments.

The disclosed system for depositing DLC films successfully demonstrates the advantages of using a filament-less RF excited inductively coupled ion gun combined with a four axis scanner and an in-situ mass spectrometer. Although the disclosed invention is specialized, its teachings will find application in other areas where existing methods are limited by prior art apparatus components.

It is understood that various modifications to the invention as described may be made, as might occur to one with skill in the field of the invention, within the scope of the claims, Therefore, all embodiments contemplated have not been shown in complete detail. Other embodiments may be developed without departing from the spirit of the invention or from the scope of the claims.

We claim:

1. An ion beam method for depositing a diamond-like carbon film onto a zinc sulfide substrate, comprising the steps of:

(1) providing a vacuum chamber;

(2) providing a radio frequency excited inductively coupled ion source for generating an ion beam of carbon-hydrogen ions inside the vacuum chamber; and, (3) accelerating the ion beam towards the zinc sulfide substrate, wherein the accelerating energy for the ion beam is about 750 eV, and wherein the carbon-hydrogen ions are generated from a flow of $CH_4$ gas and $H_2$ gas, and the ratio of the flow rate of the $CH_4$ gas to the flow rate of the $H_2$ gas is about 0.68.

2. The ion beam method for depositing a diamond-like carbon film onto a zinc sulfide substrate according to claim 1, wherein the radio frequency energy supplied by the radio frequency excited inductively coupled ion source is about 180 watts.

3. An ion beam method for depositing a diamond-like carbon film onto a zinc selenide substrate, comprising the steps of:

(1) providing a vacuum chamber;

(2) providing a radio frequency excited inductively coupled ion source for generating an ion beam of carbon-hydrogen ions inside the vacuum chamber; and, (3) accelerating the ion beam towards the zinc selenide substrate, wherein the accelerating energy for the ion beam is about 750 eV, and wherein the carbon-hydrogen ions are generated from a flow of $CH_4$ gas and $H_2$ gas, and the ratio of the flow rate of the $CH_4$ gas to the flow rate of the $H_2$ gas is about 0.68.

4. The ion beam method for depositing a diamond-like carbon film onto a zinc selenide substrate according to claim 3, wherein the radio frequency energy supplied by the radio frequency excited inductively coupled ion source is about 180 watts.

* * * * *